United States Patent
Cho et al.

(10) Patent No.: US 9,324,659 B2
(45) Date of Patent: Apr. 26, 2016

(54) SEMICONDUCTOR DEVICE AND METHOD OF FORMING POP WITH STACKED SEMICONDUCTOR DIE AND BUMPS FORMED DIRECTLY ON THE LOWER DIE

(75) Inventors: SungWon Cho, Kyoung-gi-Do (KR); DaeSik Choi, Seoul (KR); HyungSang Park, Gyeonggi-do (KR); DongSoo Moon, Kyonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 74 days.

(21) Appl. No.: 13/195,636

(22) Filed: Aug. 1, 2011

(65) Prior Publication Data
US 2013/0032952 A1 Feb. 7, 2013

(51) Int. Cl.
| H01L 21/00 | (2006.01) |
| H01L 23/538 | (2006.01) |
| H01L 23/498 | (2006.01) |
| H01L 21/56 | (2006.01) |
| H01L 23/00 | (2006.01) |
| H01L 21/683 | (2006.01) |

(Continued)

(52) U.S. Cl.
CPC .......... *H01L 23/5389* (2013.01); *H01L 21/561* (2013.01); *H01L 21/568* (2013.01); *H01L 21/6835* (2013.01); *H01L 23/49811* (2013.01); *H01L 23/49827* (2013.01); *H01L 24/96* (2013.01); *H01L 25/03* (2013.01); *H01L 25/0657* (2013.01); *H01L 25/50* (2013.01); *H01L 23/3107* (2013.01); *H01L 2221/6834* (2013.01); *H01L 2221/68336* (2013.01); *H01L 2221/68381* (2013.01); *H01L 2224/12105* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/06548* (2013.01); *H01L 2225/06558* (2013.01); *H01L 2924/01029* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/1815* (2013.01); *H01L 2924/19107* (2013.01)

(58) Field of Classification Search
None
See application file for complete search history.

(56) References Cited

U.S. PATENT DOCUMENTS

| 5,424,245 A * | 6/1995 | Gurtler et al. ................ 438/107 |
| 6,229,217 B1 | 5/2001 | Fukui et al. |

(Continued)

*Primary Examiner* — David E Graybill
(74) *Attorney, Agent, or Firm* — Robert D. Atkins; Patent Law Group: Atkins and Associates, P.C.

(57) ABSTRACT

A semiconductor device has a first semiconductor wafer mounted to a carrier. A second semiconductor wafer is mounted to the first semiconductor wafer. The first and second semiconductor wafers are singulated to separate stacked first and second semiconductor die. A peripheral region between the stacked semiconductor die is expanded. A conductive layer is formed over the carrier between the stacked semiconductor die. Alternatively, a conductive via is formed partially through the carrier. A bond wire is formed between contact pads on the second semiconductor die and the conductive layer or conductive via. An encapsulant is deposited over the stacked semiconductor die, bond wire, and carrier. The carrier is removed to expose the conductive layer or conductive via and contact pads on the first semiconductor die. Bumps are formed directly on the conductive layer and contact pads on the first semiconductor die.

23 Claims, 15 Drawing Sheets

(51) Int. Cl.
*H01L 25/03* (2006.01)
*H01L 25/065* (2006.01)
*H01L 25/00* (2006.01)
*H01L 23/31* (2006.01)

(56) References Cited

U.S. PATENT DOCUMENTS

| | | | | |
|---|---|---|---|---|
| 6,552,426 | B2* | 4/2003 | Ishio et al. | 257/692 |
| 6,670,206 | B2* | 12/2003 | Kim et al. | 438/26 |
| 6,768,190 | B2* | 7/2004 | Yang et al. | 257/686 |
| 7,026,709 | B2 | 4/2006 | Tsai et al. | |
| 7,208,335 | B2* | 4/2007 | Boon et al. | 438/33 |
| 7,221,041 | B2 | 5/2007 | Lin et al. | |
| 7,569,421 | B2* | 8/2009 | Do et al. | 438/113 |
| 7,618,846 | B1* | 11/2009 | Pagaila et al. | 438/113 |
| 7,648,911 | B2* | 1/2010 | Pagaila et al. | 438/667 |
| 7,659,145 | B2* | 2/2010 | Do et al. | 438/109 |
| 7,666,711 | B2* | 2/2010 | Pagaila et al. | 438/114 |
| 7,687,318 | B2* | 3/2010 | Do et al. | 438/113 |
| 7,704,796 | B2* | 4/2010 | Pagaila et al. | 438/113 |
| 7,723,159 | B2* | 5/2010 | Do et al. | 438/113 |
| 7,741,156 | B2* | 6/2010 | Pagaila et al. | 438/113 |
| 7,750,452 | B2* | 7/2010 | Do et al. | 257/686 |
| 7,759,783 | B2 | 7/2010 | Lee et al. | |
| 7,776,655 | B2* | 8/2010 | Do et al. | 438/113 |
| 7,829,998 | B2* | 11/2010 | Do et al. | 257/698 |
| 7,842,607 | B2* | 11/2010 | Tay et al. | 438/637 |
| 7,855,100 | B2* | 12/2010 | Shim et al. | 438/107 |
| 7,859,085 | B2* | 12/2010 | Pagaila et al. | 257/621 |
| 7,859,099 | B2* | 12/2010 | Choi et al. | 257/698 |
| 7,880,275 | B2* | 2/2011 | Pagaila et al. | 257/659 |
| 7,902,638 | B2* | 3/2011 | Do et al. | 257/620 |
| 7,956,449 | B2* | 6/2011 | Lee et al. | 257/686 |
| 7,960,841 | B2* | 6/2011 | Do et al. | 257/774 |
| 7,982,298 | B1* | 7/2011 | Kang et al. | 257/686 |
| 8,030,136 | B2* | 10/2011 | Pagaila et al. | 438/113 |
| 8,062,929 | B2* | 11/2011 | Do et al. | 438/109 |
| 8,072,079 | B2* | 12/2011 | Pagaila et al. | 257/774 |
| 8,080,882 | B2* | 12/2011 | Do et al. | 257/774 |
| 8,080,885 | B2* | 12/2011 | Chow et al. | 257/787 |
| 8,093,151 | B2* | 1/2012 | Pagaila et al. | 438/667 |
| 8,101,460 | B2* | 1/2012 | Pagaila et al. | 438/109 |
| 8,174,098 | B2* | 5/2012 | Tay et al. | 257/675 |
| 8,193,034 | B2* | 6/2012 | Pagaila et al. | 438/108 |
| 8,203,203 | B1* | 6/2012 | Scanlan | 257/686 |
| 8,227,338 | B1* | 7/2012 | Scanlan et al. | 438/637 |
| 8,247,268 | B2* | 8/2012 | Do et al. | 438/107 |
| 8,258,010 | B2* | 9/2012 | Pagaila et al. | 438/113 |
| 8,258,012 | B2* | 9/2012 | Pagaila et al. | 438/113 |
| 8,273,604 | B2* | 9/2012 | Kim et al. | 438/113 |
| 8,278,746 | B2* | 10/2012 | Ding et al. | 257/686 |
| 8,283,250 | B2* | 10/2012 | Tay et al. | 438/667 |
| 8,288,203 | B2* | 10/2012 | Cho et al. | 438/107 |
| 8,304,286 | B2* | 11/2012 | Pagaila et al. | 438/109 |
| 8,341,835 | B1* | 1/2013 | Huemoeller et al. | 29/841 |
| 8,405,197 | B2* | 3/2013 | Ha et al. | 257/686 |
| 8,445,325 | B2* | 5/2013 | Do et al. | 438/113 |
| 8,471,376 | B1* | 6/2013 | Liou et al. | 257/686 |
| 8,492,201 | B2* | 7/2013 | Pagaila et al. | 438/113 |
| 8,518,746 | B2* | 8/2013 | Pagaila et al. | 438/113 |
| 8,525,337 | B2* | 9/2013 | Pendse | 257/738 |
| 8,525,344 | B2* | 9/2013 | Pagaila et al. | 257/774 |
| 8,592,950 | B2* | 11/2013 | Pagaila et al. | 257/620 |
| 8,623,702 | B2* | 1/2014 | Pagaila | 438/113 |
| 8,716,853 | B2* | 5/2014 | Do et al. | 257/684 |
| 8,796,137 | B2* | 8/2014 | Pagaila et al. | 438/666 |
| 8,815,643 | B2* | 8/2014 | Do et al. | 438/114 |
| 8,822,281 | B2* | 9/2014 | Pagaila et al. | 438/190 |
| 8,884,416 | B2* | 11/2014 | Lee et al. | 257/686 |
| 8,895,440 | B2* | 11/2014 | Choi et al. | 438/675 |
| 2002/0045290 | A1* | 4/2002 | Ball | 438/106 |
| 2004/0103509 | A1* | 6/2004 | Bidard et al. | 29/25.35 |
| 2005/0133932 | A1* | 6/2005 | Pohl et al. | 257/777 |
| 2005/0212126 | A1* | 9/2005 | Sunohara | 257/730 |
| 2006/0043573 | A1* | 3/2006 | Hedler et al. | 257/700 |
| 2006/0227587 | A1* | 10/2006 | Nakamura et al. | 365/63 |
| 2007/0108605 | A1 | 5/2007 | Yoon et al. | |
| 2008/0054451 | A1* | 3/2008 | Bauer et al. | 257/723 |
| 2008/0145589 | A1 | 6/2008 | Hung et al. | |
| 2008/0272368 | A1* | 11/2008 | Do et al. | 257/40 |
| 2008/0272464 | A1* | 11/2008 | Do et al. | 257/620 |
| 2008/0272465 | A1* | 11/2008 | Do et al. | 257/620 |
| 2008/0272470 | A1* | 11/2008 | Do et al. | 257/666 |
| 2008/0272476 | A1* | 11/2008 | Do et al. | 257/686 |
| 2008/0272477 | A1* | 11/2008 | Do et al. | 257/686 |
| 2008/0272504 | A1* | 11/2008 | Do et al. | 257/797 |
| 2009/0008793 | A1* | 1/2009 | Pohl et al. | 257/777 |
| 2009/0039523 | A1* | 2/2009 | Jiang et al. | 257/777 |
| 2009/0085186 | A1* | 4/2009 | Meyer | 257/690 |
| 2009/0085225 | A1* | 4/2009 | Park | 257/777 |
| 2009/0108428 | A1 | 4/2009 | Carson et al. | |
| 2009/0127683 | A1 | 5/2009 | Do et al. | |
| 2009/0127686 | A1* | 5/2009 | Yang et al. | 257/686 |
| 2009/0130840 | A1* | 5/2009 | Wang et al. | 438/614 |
| 2009/0152740 | A1 | 6/2009 | Park et al. | |
| 2009/0224391 | A1* | 9/2009 | Lin et al. | 257/690 |
| 2009/0230531 | A1* | 9/2009 | Do et al. | 257/685 |
| 2009/0236686 | A1* | 9/2009 | Shim et al. | 257/528 |
| 2009/0243045 | A1* | 10/2009 | Pagaila et al. | 257/621 |
| 2009/0261466 | A1* | 10/2009 | Pagaila et al. | 257/686 |
| 2009/0267236 | A1* | 10/2009 | Do et al. | 257/774 |
| 2009/0283870 | A1* | 11/2009 | Pagaila et al. | 257/620 |
| 2009/0294899 | A1* | 12/2009 | Pagaila et al. | 257/528 |
| 2009/0294911 | A1* | 12/2009 | Pagaila et al. | 257/620 |
| 2009/0294914 | A1* | 12/2009 | Pagaila et al. | 257/621 |
| 2009/0302435 | A1* | 12/2009 | Pagaila et al. | 257/659 |
| 2009/0302445 | A1* | 12/2009 | Pagaila et al. | 257/678 |
| 2009/0302478 | A1* | 12/2009 | Pagaila et al. | 257/774 |
| 2010/0007000 | A1 | 1/2010 | Kim et al. | |
| 2010/0007029 | A1* | 1/2010 | Do et al. | 257/774 |
| 2010/0013102 | A1* | 1/2010 | Tay et al. | 257/774 |
| 2010/0019359 | A1* | 1/2010 | Pagaila et al. | 257/659 |
| 2010/0072570 | A1* | 3/2010 | Pagaila et al. | 257/528 |
| 2010/0078828 | A1 | 4/2010 | Huang et al. | |
| 2010/0096731 | A1* | 4/2010 | Do et al. | 257/620 |
| 2010/0102456 | A1* | 4/2010 | Pagaila et al. | 257/774 |
| 2010/0102458 | A1 | 4/2010 | Chow et al. | |
| 2010/0123251 | A1 | 5/2010 | Chow et al. | |
| 2010/0140751 | A1* | 6/2010 | Tay et al. | 257/621 |
| 2010/0140780 | A1* | 6/2010 | Huang et al. | 257/690 |
| 2010/0140799 | A1* | 6/2010 | Do et al. | 257/737 |
| 2010/0155922 | A1* | 6/2010 | Pagaila et al. | 257/686 |
| 2010/0193931 | A1* | 8/2010 | Do et al. | 257/686 |
| 2010/0213618 | A1* | 8/2010 | Pagaila et al. | 257/774 |
| 2010/0216281 | A1* | 8/2010 | Pagaila et al. | 438/107 |
| 2010/0230822 | A1* | 9/2010 | Pagaila et al. | 257/773 |
| 2010/0233852 | A1* | 9/2010 | Do et al. | 438/109 |
| 2010/0237471 | A1* | 9/2010 | Pagaila et al. | 257/621 |
| 2011/0037168 | A1* | 2/2011 | Tay et al. | 257/713 |
| 2011/0111591 | A1* | 5/2011 | Do et al. | 438/667 |
| 2011/0123251 | A1 | 5/2011 | Qiu et al. | |
| 2011/0124156 | A1* | 5/2011 | Do et al. | 438/107 |
| 2011/0177654 | A1* | 7/2011 | Lee et al. | 438/107 |
| 2011/0227220 | A1* | 9/2011 | Chen et al. | 257/738 |
| 2011/0278741 | A1* | 11/2011 | Chua et al. | 257/777 |
| 2011/0316133 | A1 | 12/2011 | Do et al. | |
| 2012/0018885 | A1* | 1/2012 | Lee et al. | 257/738 |
| 2012/0032340 | A1* | 2/2012 | Choi et al. | 257/777 |
| 2012/0196406 | A1* | 8/2012 | Pendse | 438/124 |
| 2012/0199963 | A9* | 8/2012 | Do et al. | 257/686 |
| 2012/0217629 | A1* | 8/2012 | Cho et al. | 257/692 |
| 2012/0217643 | A1* | 8/2012 | Pagaila et al. | 257/774 |
| 2012/0244661 | A9* | 9/2012 | Do et al. | 438/107 |
| 2013/0032952 | A1* | 2/2013 | Cho et al. | 257/777 |
| 2013/0292829 | A1* | 11/2013 | Pendse | 257/737 |

* cited by examiner

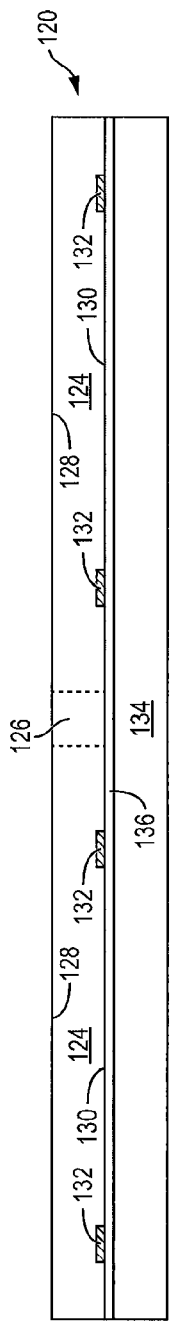
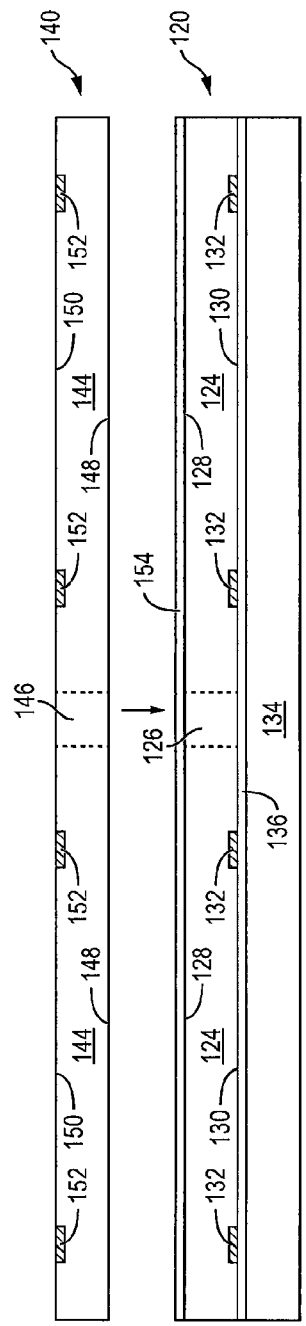
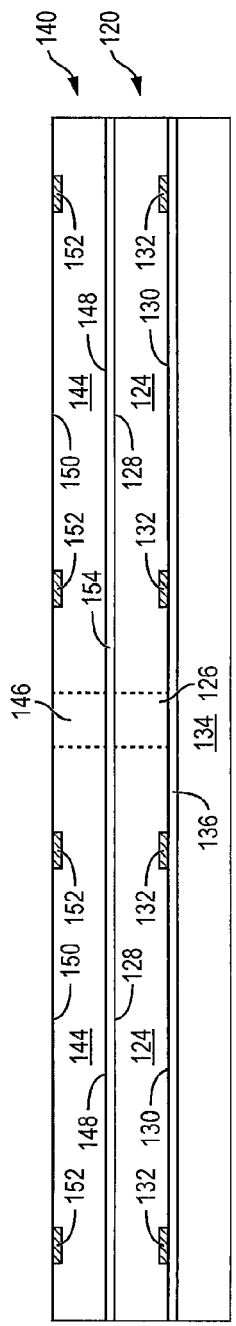
FIG. 4c
FIG. 4d
FIG. 4e

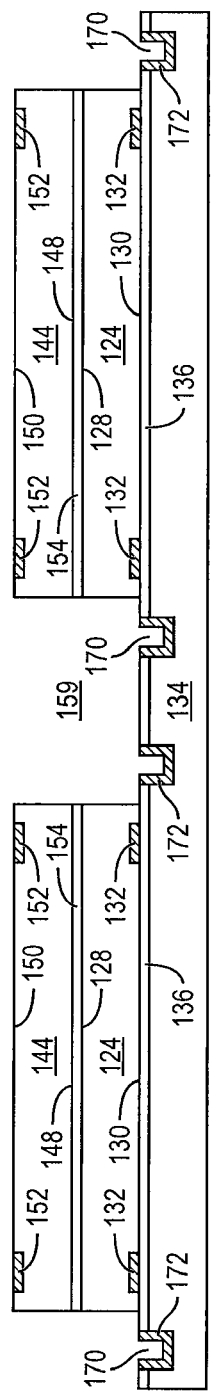
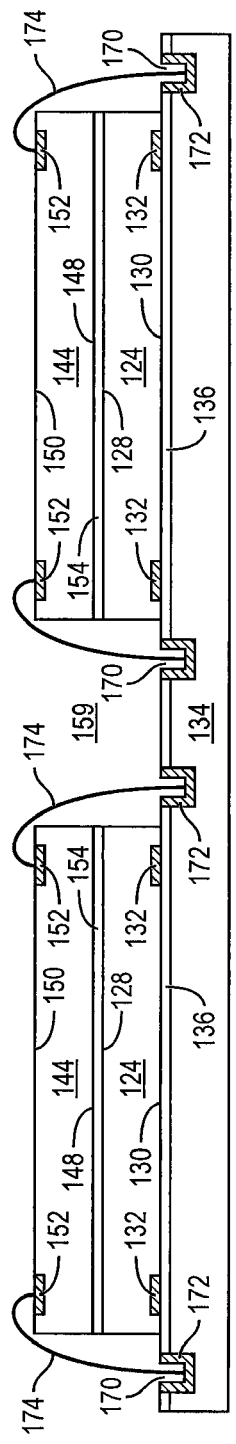

US 9,324,659 B2

SEMICONDUCTOR DEVICE AND METHOD OF FORMING POP WITH STACKED SEMICONDUCTOR DIE AND BUMPS FORMED DIRECTLY ON THE LOWER DIE

FIELD OF THE INVENTION

The present invention relates in general to semiconductor devices and, more particularly, to a semiconductor device and method of forming a semiconductor PoP with stacked semiconductor die and bumps formed directly on the lower die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1 illustrates a conventional semiconductor package-on-package (PoP) 10 having a flipchip type semiconductor die 12 mounted to substrate 14. Substrate 14 includes upper and lower conductive layers 16 and upper and lower insulating layers 18. Bumps 20 electrically connect contact pads 22 on semiconductor die 12 to the upper conductive layer 16. An underfill material 24 is deposited between semiconductor die 12 and substrate 14 and around bumps 20. Semiconductor die 26 is mounted back surface-to-back surface of semiconductor die 12 with adhesive 28. Bond wires 30 are formed between contact pads 32 of semiconductor die 26 and the upper conductive layer 16. An encapsulant 34 is deposited over semiconductor die 12 and 26 and substrate 14. A plurality of bumps 36 is formed over the lower conductive layer 16.

One disadvantage of semiconductor PoP 10 is that substrate 14 tends to increase the overall height or profile. In addition, semiconductor die 12 is individually mounted to substrate 14 and then semiconductor die 26 is individually mounted to semiconductor die 12. The individual stacking of semiconductor die 12 and 26 is time consuming, adds cost to the manufacturing process, and is prone to defects.

SUMMARY OF THE INVENTION

A need exists for simple and cost effective vertical stacking of semiconductor die, while reducing package height. Accordingly, in one embodiment, the present invention is a method of making a semiconductor device comprising the steps of providing a carrier, mounting a first semiconductor wafer to the carrier, mounting a second semiconductor wafer to the first semiconductor wafer, singulating the first and second semiconductor wafers to separate stacked first and second semiconductor die of the first and second semiconductor wafers, forming a conductive layer over the carrier between the stacked first and second semiconductor die, forming a bond wire between contact pads on the second semiconductor die and the conductive layer, depositing an encapsulant over the stacked first and second semiconductor die, bond wire, and carrier, removing the carrier to expose the conductive layer and contact pads on the first semiconductor die, and forming bumps directly on the conductive layer and contact pads on the first semiconductor die.

In another embodiment, the present invention is a method of making a semiconductor device comprising the steps of providing a carrier, mounting a first wafer to the carrier, mounting a second wafer to the first wafer, singulating the first and second wafers to separate stacked first and second components of the first and second wafers, depositing a first encapsulant over the stacked first and second components and carrier, removing the carrier, and forming an interconnect structure directly on the first component.

In another embodiment, the present invention is a method of making a semiconductor device comprising the steps of providing a carrier, mounting a first component to the carrier, mounting a second component to the first component, depositing a first encapsulant over the first and second components and carrier, removing the carrier, and forming an interconnect structure directly on the first component.

In another embodiment, the present invention is a semiconductor device comprising a first component and second component mounted to the first component. A first encapsulant is deposited over the first and second components. A first interconnect structure is formed directly on the first component.

BRIEF DESCRIPTION OF THE DRAWINGS

FIGS. 6a-6g illustrate a method of forming a PoP with stacked semiconductor die and a protruding conductive layer and bumps formed directly on the lower die;

DETAILED DESCRIPTION OF THE DRAWINGS

Figure 1:
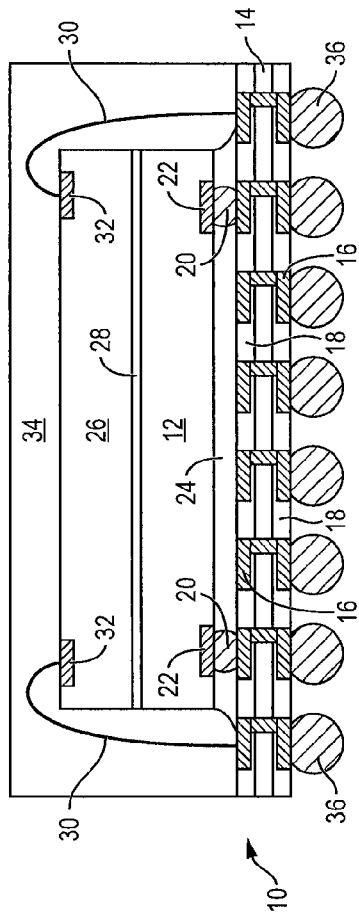
FIG. 1 illustrates a conventional semiconductor PoP with two semiconductor die stacked over a substrate.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
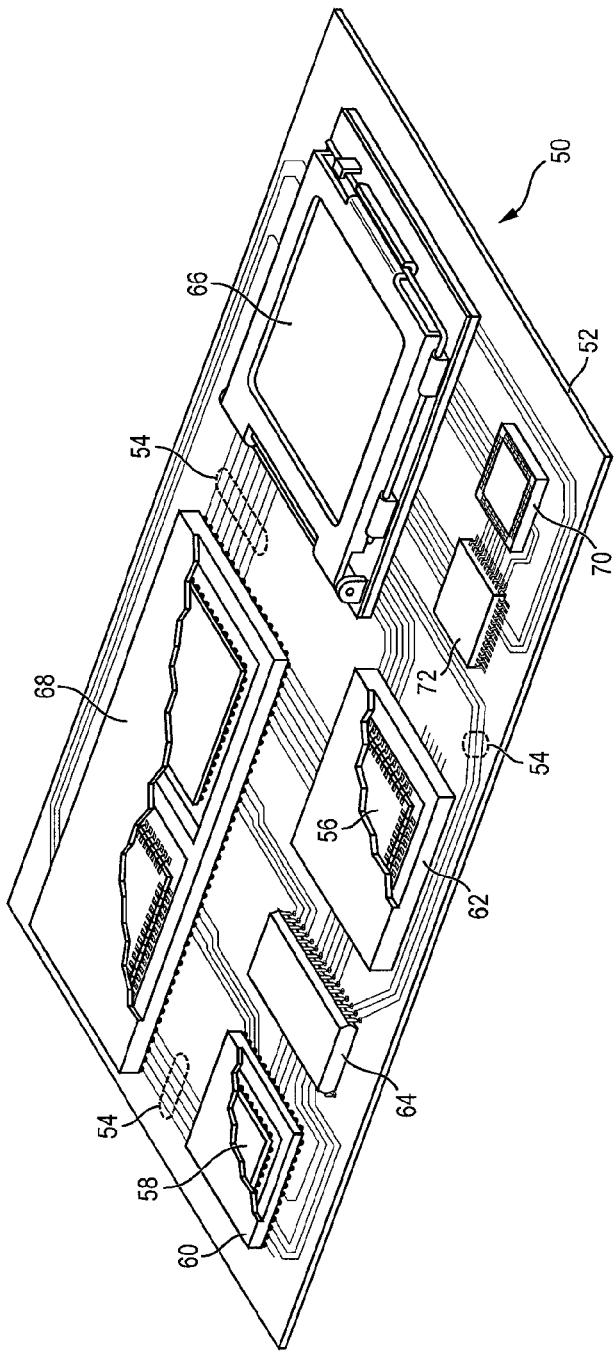
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may have only the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
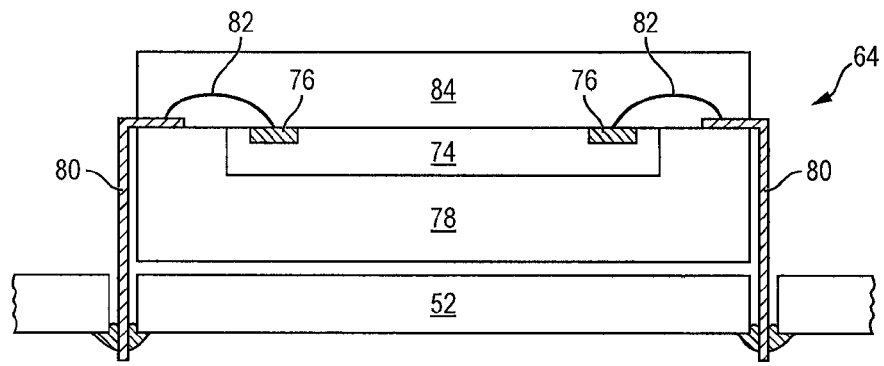
FIGS. 3a-3c illustrate further detail of the representative semiconductor packages mounted to the PCB.
Figure 3B:
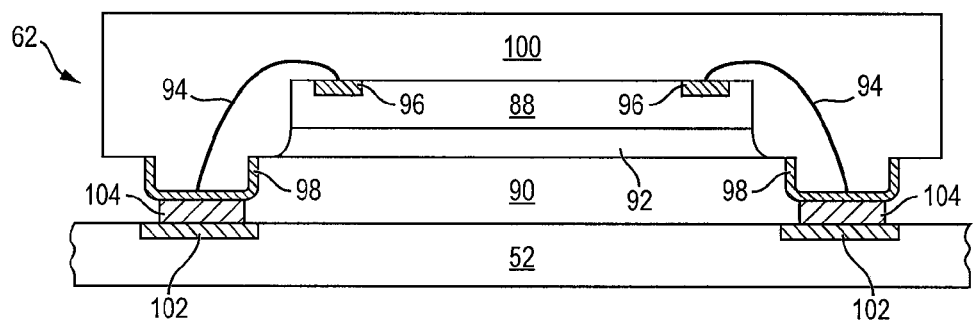
Figure 3C:
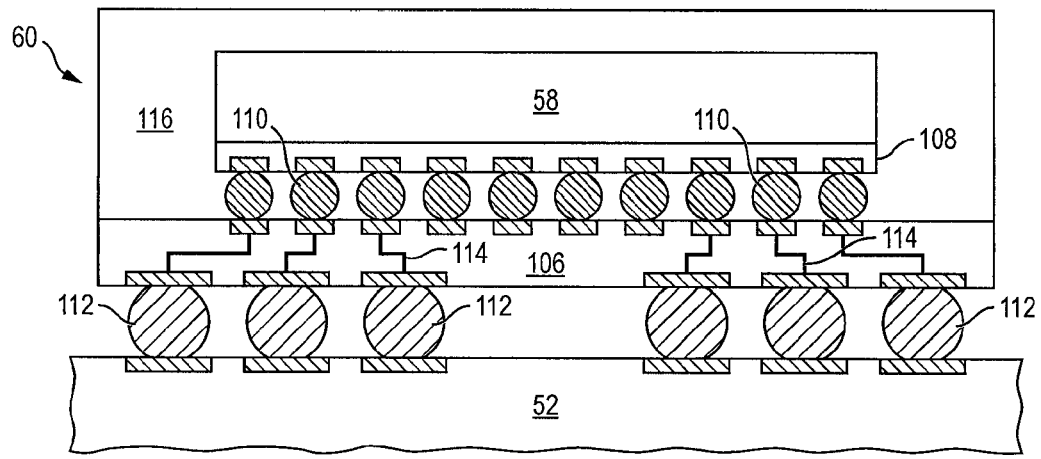

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
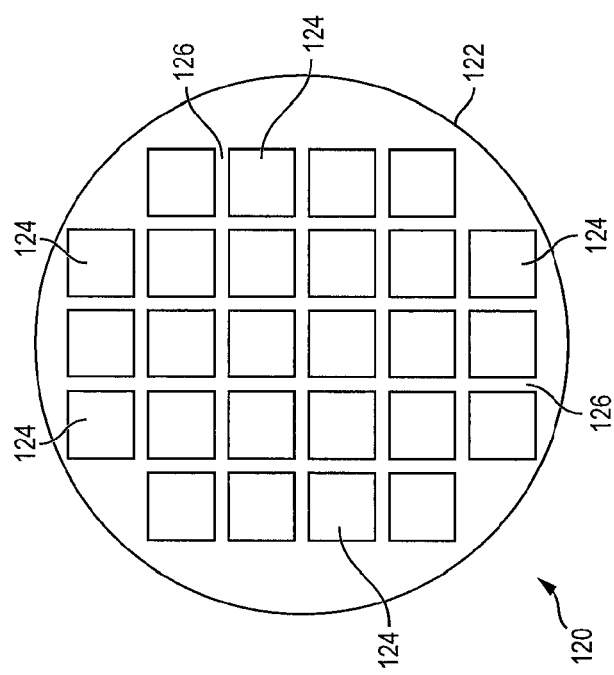
FIGS. 4a-4n illustrate a process of forming a PoP with stacked semiconductor die and bumps formed directly on the lower die.
Figure 4B:
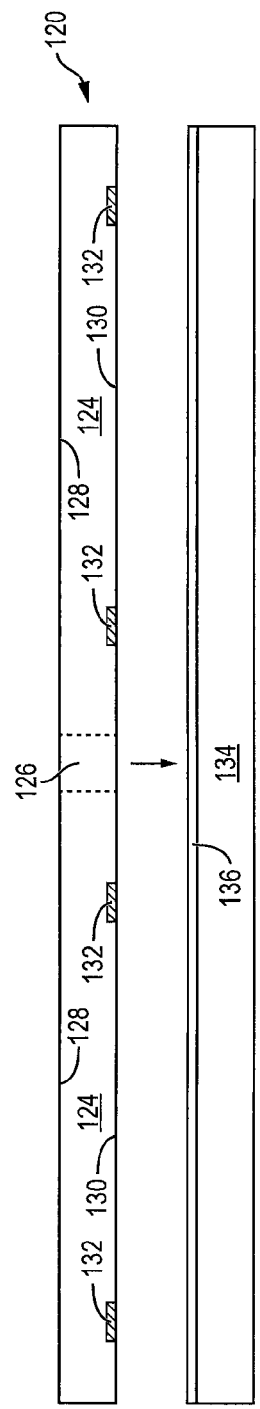
Figure 4F:
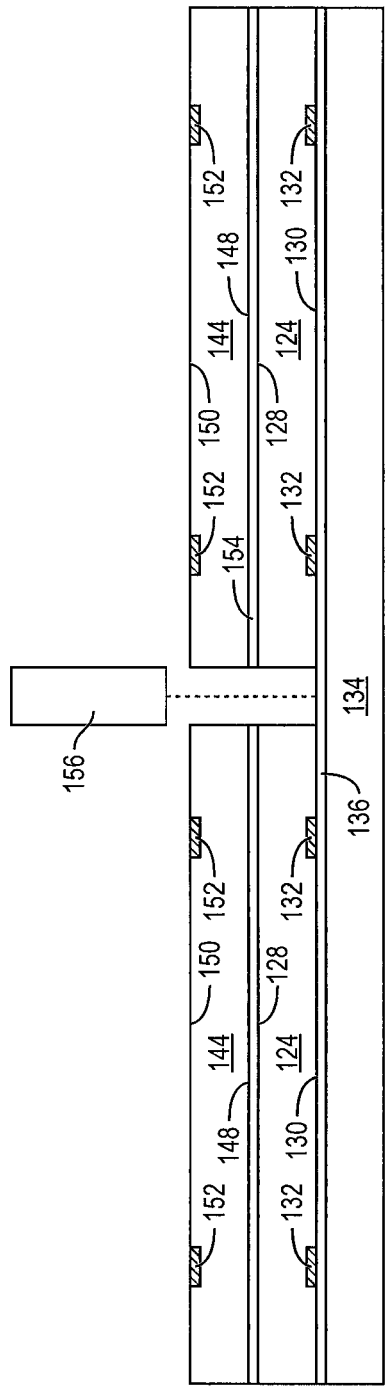
Figure 4G:
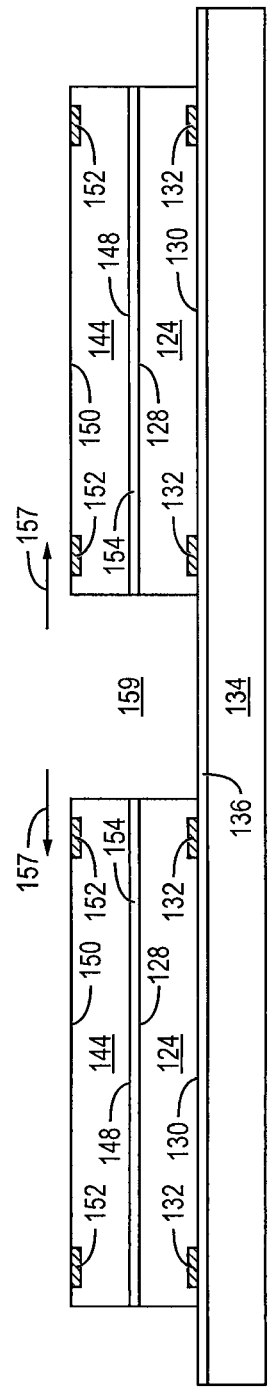
Figure 4H:
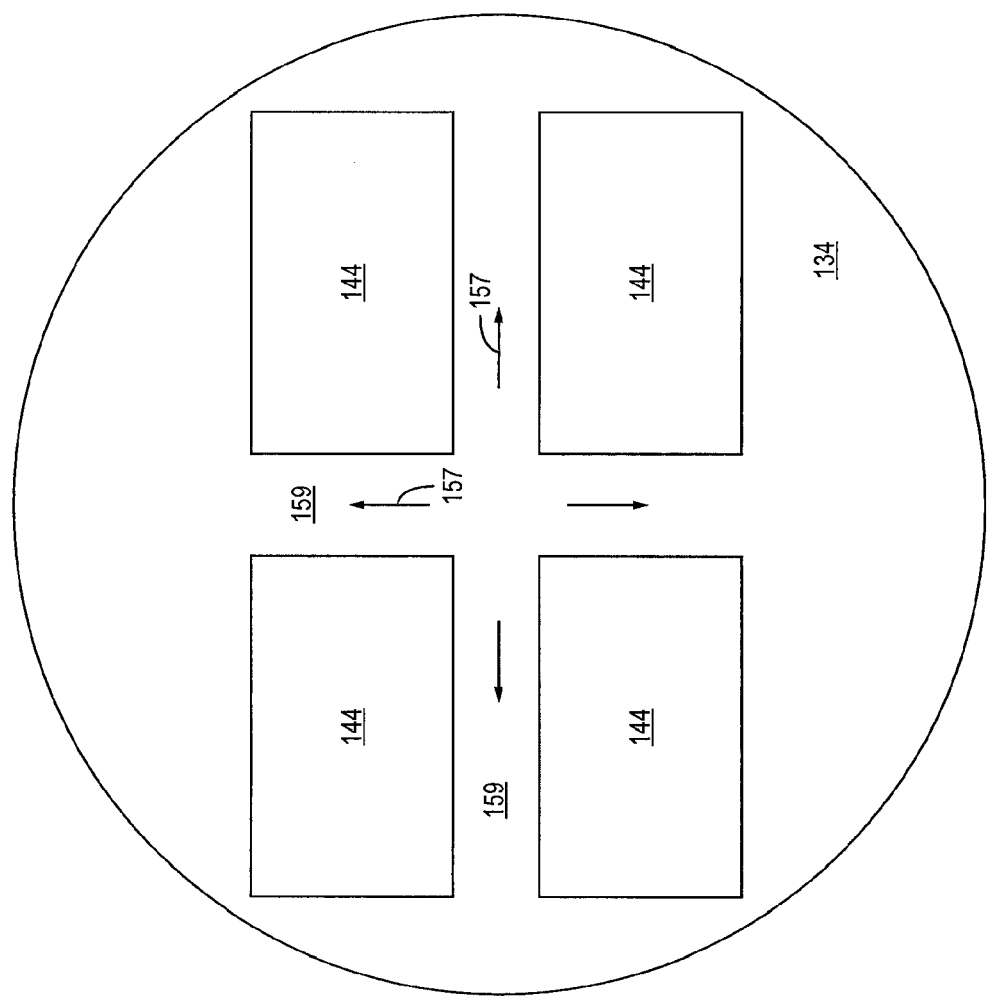
Figure 4I:
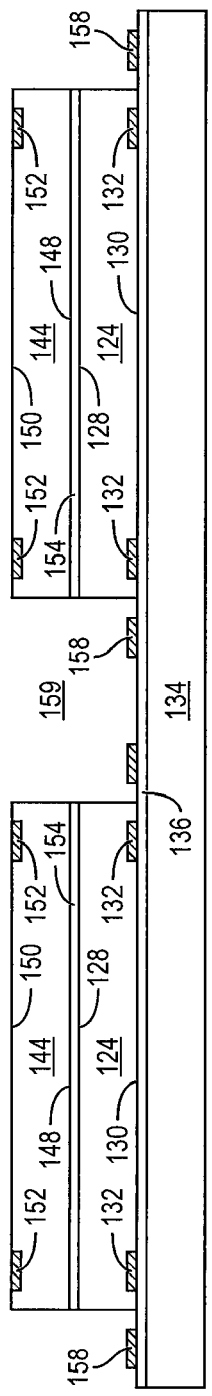
Figure 4J:
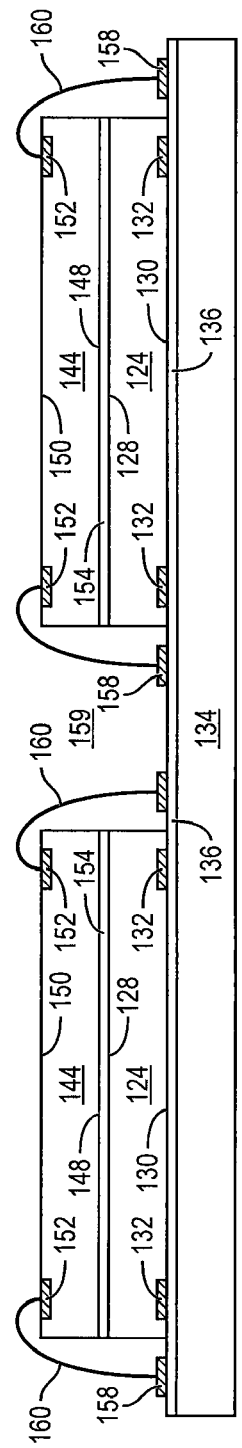
Figure 4K:
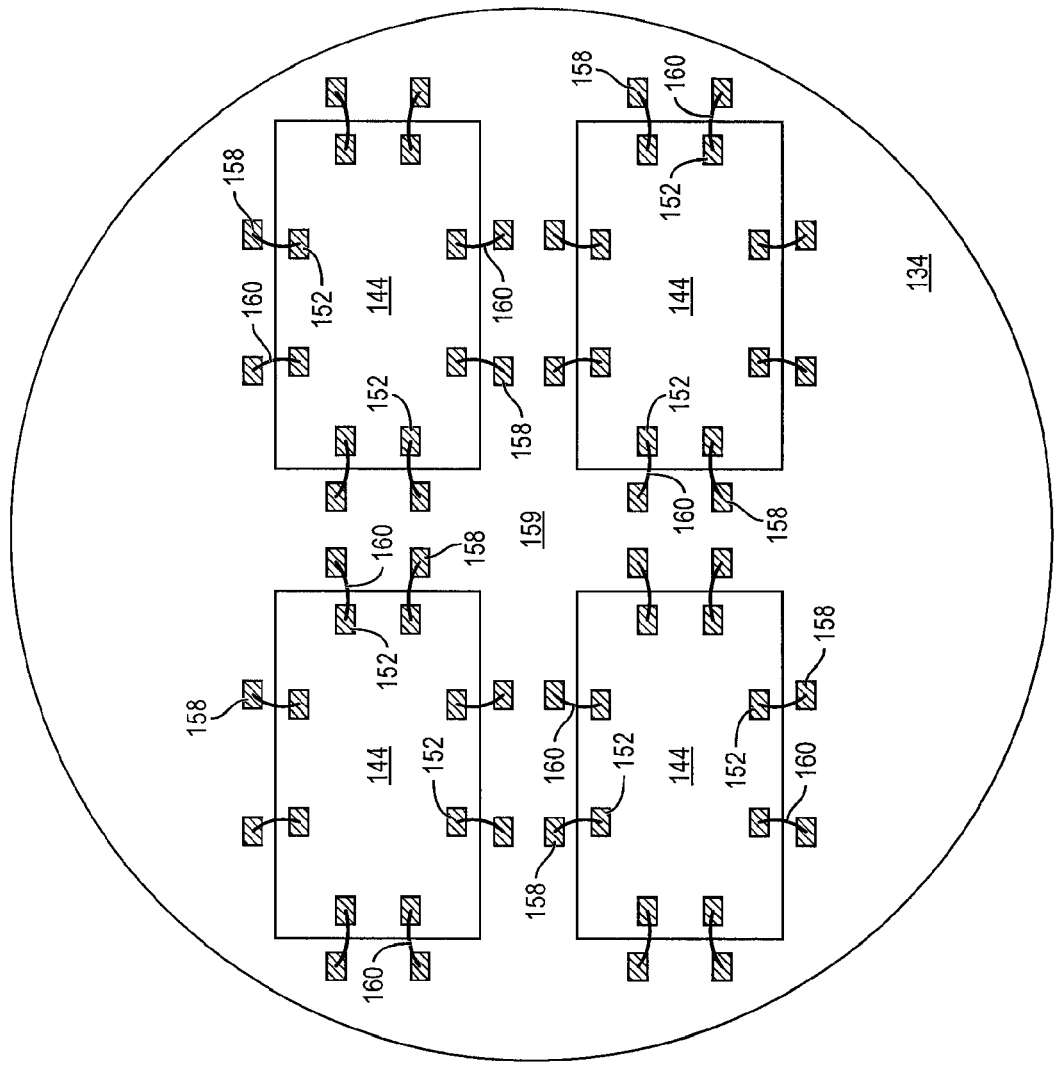
Figure 4L:
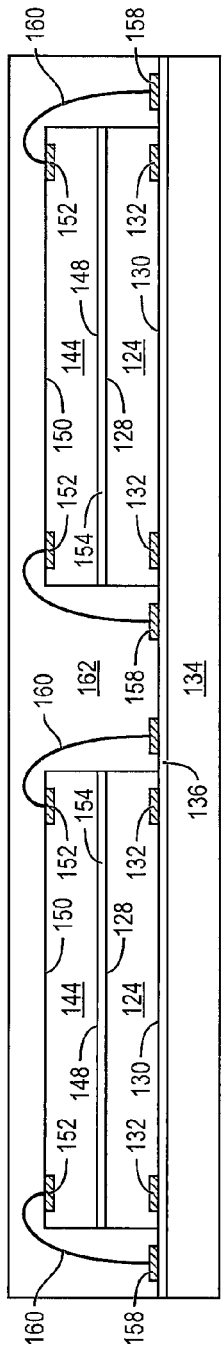
Figure 4M:
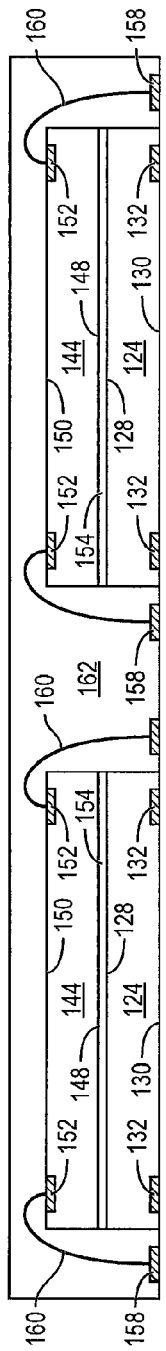
Figure 4N:
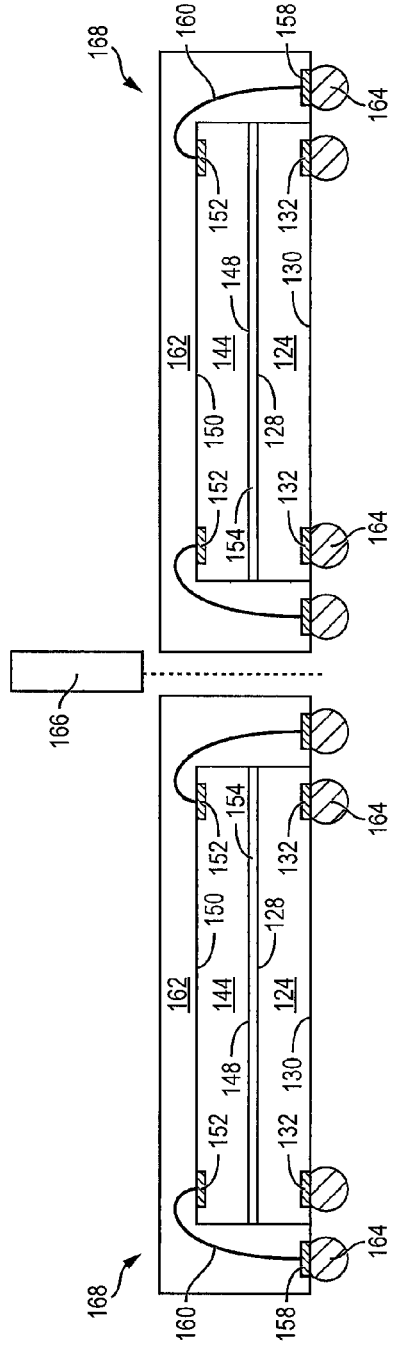

FIGS. 4a-4n illustrate, in relation to FIGS. 2 and 3a-3c, a process of forming a semiconductor PoP with stacked semiconductor die and bumps formed directly on the lower die. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die.

A temporary carrier 134 contains a sacrificial base material such as silicon, germanium, gallium arsenide, indium phosphide, silicon carbide, resin, or other suitable low-cost, rigid material for structural support. An interface layer or double-sided tape 136 is formed over carrier 134 as a temporary adhesive bonding film or etch-stop layer. Semiconductor wafer 120 is positioned over and mounted to carrier 134 and interface layer 136, as shown in FIG. 4c.

FIG. 4d shows a semiconductor wafer 140 with a base substrate material, such as silicon, germanium, gallium arsenide, indium phosphide, or silicon carbide, for structural support. A plurality of semiconductor die or components 144 is formed on wafer 140 separated by inter-die wafer area or saw streets 146 as described above. Saw streets 146 provide cutting areas to singulate semiconductor wafer 140 into individual semiconductor die 144.

Each semiconductor die 144 has a back surface 148 and active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 144 may also contain IPDs, such as inductors, capacitors, and resistors, for RF signal processing. An electrically conductive layer 152 is formed over active surface 150 using PVD, CVD, electrolytic plating, electroless plating process, or other suitable metal deposition process. Conductive layer 152 can be one or more layers of Al, Cu, Sn, Ni, Au, Ag, or other suitable electrically conductive material. Conductive layer 152 operates as contact pads electrically connected to the circuits on active surface 150.

Semiconductor die 144 can have the same electrical function as semiconductor die 124, or semiconductor die 144 can have a different electrical function than semiconductor die 124. An adhesive layer 154 is formed over back surface 128 of semiconductor wafer 120. Semiconductor wafer 140 is positioned over and mounted to semiconductor wafer 120 with adhesive layer 154, as shown in FIG. 4e. Saw street 126 of semiconductor wafer 120 is aligned with saw street 146 of semiconductor wafer 140.

In FIG. 4f, semiconductor wafer 120 and semiconductor wafer 140 are singulated through saw streets 126 and 146 using a saw blade or laser cutting tool 156 into stacked semiconductor die 124 and 144. A suitable cutting tool 156 can be a thick blade saw, etching saw, or water jet saw.

In FIG. 4g, the stacked semiconductor die 124 and 144 are separated using an expansion table that moves in two-dimension lateral directions, as shown by arrows 157, to expand the spacing and create greater physical separation between the stacked semiconductor die. FIG. 4h is a plan view of the expansion table moving substantially the same distance in the x-axis and y-axis by arrows 157 within the tolerance of the table control to increase width of peripheral region 159 and separation between the stacked semiconductor die 124 and 144. The post-expansion width of peripheral region 159 ranges from 5-200 μm.

In FIG. 4i, an electrically conductive layer or seed layer 158 is formed over carrier 134 within peripheral region 159 between the stacked semiconductor 124 and 144 using a patterning and metal deposition process such as printing, PVD, CVD, sputtering, electrolytic plating, and electroless plating. Conductive layer 158 can be one or more layers of Al, Cu, Sn, Ti, Ni, Au, Ag, or other suitable electrically conductive material.

In FIG. 4j, bond wires 160 are formed between conductive layer 158 and conductive layer 152 on semiconductor die 144. FIG. 4k shows a plan view of bond wires 160 formed between conductive layer 158 and conductive layer 152 on semiconductor die 144. The expanded peripheral region 159 from FIGS. 4g-4h provides sufficient space to form conductive layer 158 and bond wires 160 between the stack semiconductor die 124 and 144.

In FIG. 4l, an encapsulant or molding compound 162 is deposited over semiconductor die 124 and 144, bond wires 160, and carrier 134 using a paste printing, compressive molding, transfer molding, liquid encapsulant molding, vacuum lamination, spin coating, or other suitable applicator. Encapsulant 162 can be polymer composite material, such as epoxy resin with filler, epoxy acrylate with filler, or polymer with proper filler. Encapsulant 162 is non-conductive and environmentally protects the semiconductor device from external elements and contaminants.

In FIG. 4m, carrier 134 and interface layer 136 are removed by chemical etching, mechanical peeling, CMP, mechanical grinding, thermal bake, UV light, laser scanning, or wet stripping to expose active surface 130 of semiconductor die 124, conductive layers 132 and 158, and encapsulant 162.

In FIG. 4n, an electrically conductive bump material is deposited directly on conductive layers 132 and 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 132 and 158 using a suitable attachment or bonding process. In one embodiment, the bump material is reflowed by heating the material above its melting point to form balls or bumps 164. In some applications, bumps 164 are reflowed a second time to improve electrical contact to conductive layers 132 and 158. An under bump metallization (UBM) layer can be formed under bumps 164. Bumps 164 can also be compression bonded to conductive layers 132 and 158. Bumps 164 represent one type of interconnect structure that can be formed over conductive layers 132 and 158. The interconnect structure can also be stud bumps, micro bumps, or other electrical interconnect.

Figure 5:
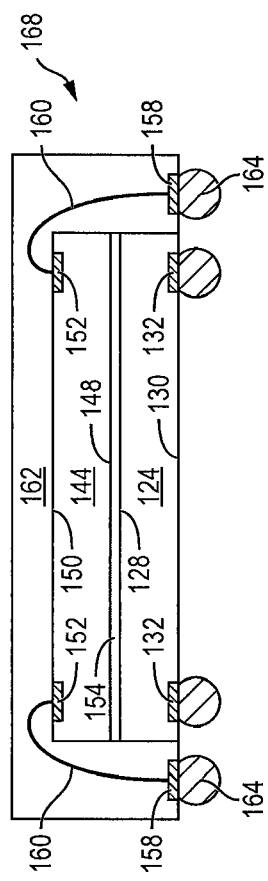
FIG. 5 illustrates the semiconductor PoP with stacked semiconductor die and bumps formed directly on the lower die.

The assembly is singulated through encapsulant 162 with saw blade or laser cutting tool 166 into individual semiconductor package-on-package (PoP) 168. FIG. 5 shows semiconductor PoP 168 after singulation. Semiconductor die 124 is electrically connected to bumps 164. Semiconductor die 144 is electrically connected through bond wires 160 to conductive layer 158 and bumps 164. Semiconductor die 124 and 144 are bonded at the wafer level. Semiconductor PoP 168 has a reduced height because bumps 164 are attached directly to conductive layer 158 and contact pads 132 of semiconductor die 124. There is no need to mount the stacked semiconductor die to a substrate, as shown in prior art FIG. 1. Carrier 134 maintains coplanarity between conductive layer 158 and contact pads 132 and uniformity of bumps 164. The exposed active surface 130 of semiconductor die 124 offers good heat dissipation and thermal characteristics.

Figure 6A:
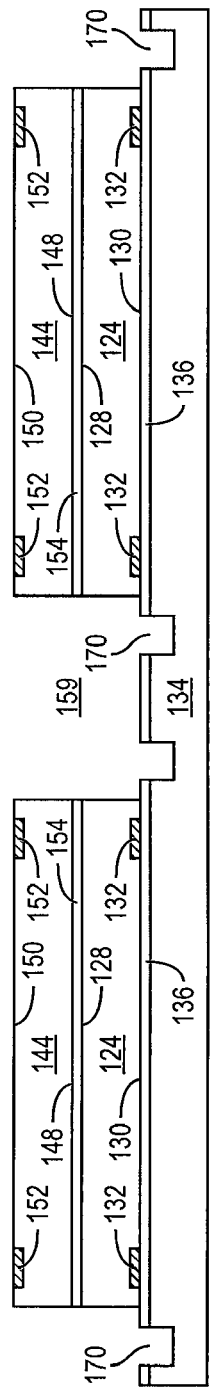

FIGS. 6*a*-6*g* illustrate, in relation to FIGS. 2 and 3*a*-3*c*, a process of forming a PoP with stacked semiconductor die and a protruding conductive layer and bumps formed directly on the lower die. Continuing from FIG. 4*h*, a plurality of vias or cavities 170 is formed partially through carrier 134 using laser drilling, mechanic drilling, etching, or DRIE, as shown in FIG. 6*a*. In FIG. 6*b*, vias 170 are filled or lined with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 172. In one embodiment, a conductive layer is conformally applied to the sidewalls and bottom surface of vias 170 by electrolytic plating or electroless plating process to form conductive vias 172.

Figure 6D:
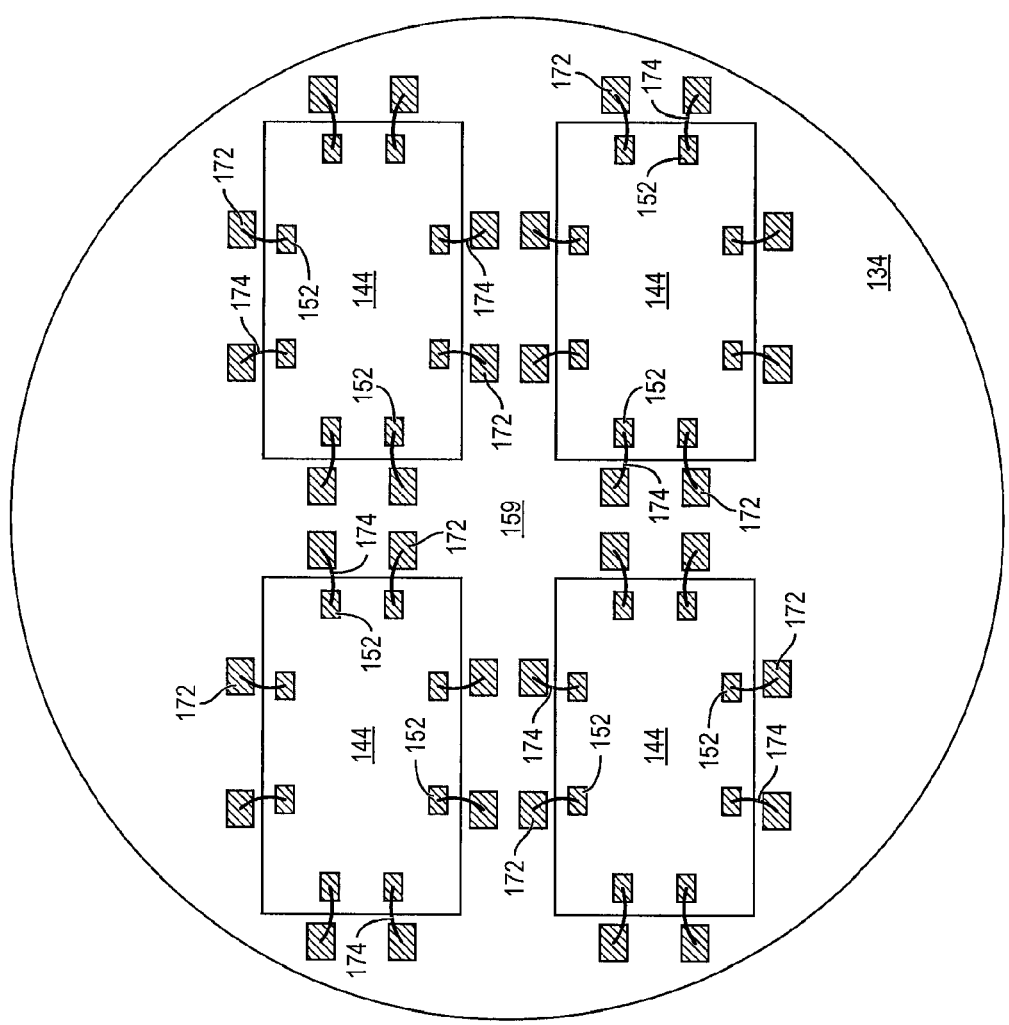

In FIG. 6*c*, bond wires 174 are formed between conductive vias 172 and conductive layer 152 on semiconductor die 144. Bond wires 174 extend into cavities 170 to bond with conductive vias 172. FIG. 6*d* shows a plan view of bond wires 174 formed between conductive vias 172 and conductive layer 152 on semiconductor die 144. The expanded peripheral region 159 from FIGS. 4*g*-4*h* provides sufficient space to form conductive vias 172 and bond wires 174 between the stacked semiconductor die 124 and 144.

Figure 6E:
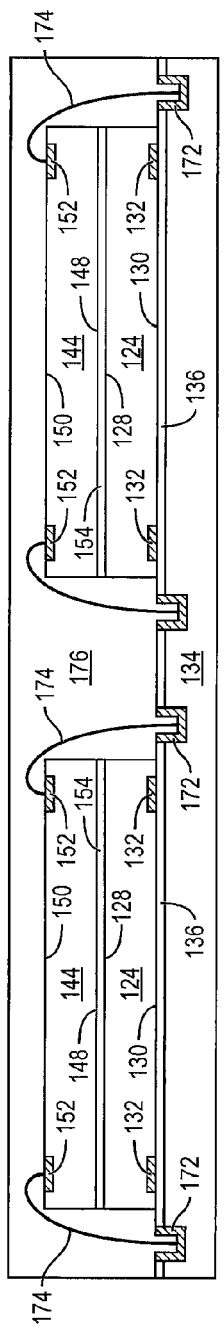

In FIG. 6*e*, an encapsulant or molding compound 176 is deposited over semiconductor die 124 and 144, bond wires 174, and carrier 134 using a paste printing, compressive molding, transfer molding, liquid encapsulant molding, vacuum lamination, spin coating, or other suitable applicator. Encapsulant fills the remaining portion of vias 170 not occupied by the conductive layer 172. Encapsulant 176 can be polymer composite material, such as epoxy resin with filler, epoxy acrylate with filler, or polymer with proper filler. Encapsulant 176 is non-conductive and environmentally protects the semiconductor device from external elements and contaminants.

Figure 6F:
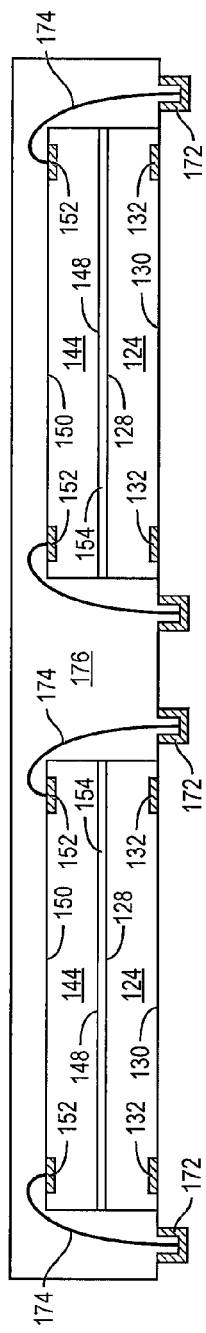

In FIG. 6*f*, carrier 134 and interface layer 136 are removed by chemical etching, mechanical peeling, CMP, mechanical grinding, thermal bake, UV light, laser scanning, or wet stripping to expose active surface 130 of semiconductor die 124, conductive layer 132, conductive vias 172, and encapsulant 176. By nature of forming vias 170 partially through carrier 134, conductive vias 172 extend below or protrude beyond a level of the exposed active surface 130 of semiconductor die 124.

Figure 6G:
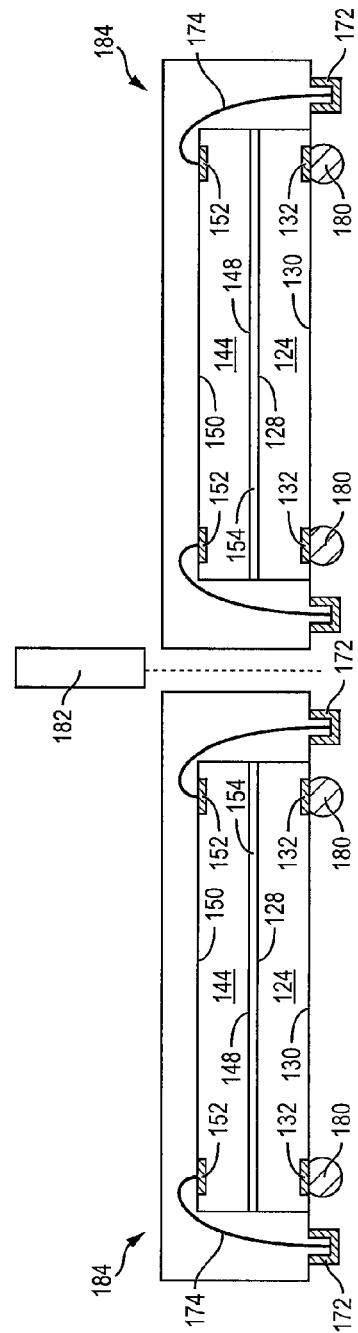

In FIG. 6*g*, an electrically conductive bump material is deposited directly on conductive layer 132 of semiconductor die 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 180. In some applications, bumps 180 are reflowed a second time to improve electrical contact to conductive layer 132. A UBM layer can be formed under bumps 180. Bumps 180 can also be compression bonded to conductive layer 132. Bumps 180 represent one type of interconnect structure that can be formed over conductive layer 132. The interconnect structure can also be stud bumps, micro bumps, or other electrical interconnect.

Figure 7:
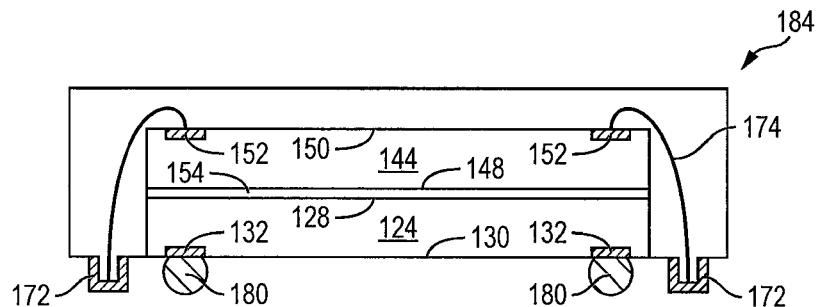
FIG. 7 illustrates the semiconductor PoP with stacked semiconductor die and a protruding conductive layer and bumps formed directly on the lower die.

The assembly is singulated through encapsulant 176 with saw blade or laser cutting tool 182 into individual semiconductor PoP 184. FIG. 7 shows semiconductor PoP 184 after singulation. Semiconductor die 124 is electrically connected to bumps 180. Semiconductor die 144 is electrically connected through bond wires 174 to conductive vias 172. Semiconductor die 124 and 144 are bonded at the wafer level. Semiconductor PoP 184 has a reduced height because bumps 180 are attached directly to contact pads 132 of semiconductor die 124. There is no need to mount the stacked semiconductor die to a substrate, as shown in prior art FIG. 1. The protruding conductive vias 172 are substantially coplanar with bumps 180. The exposed active surface 130 of semiconductor die 124 offers good heat dissipation and thermal characteristics.

Figure 8:
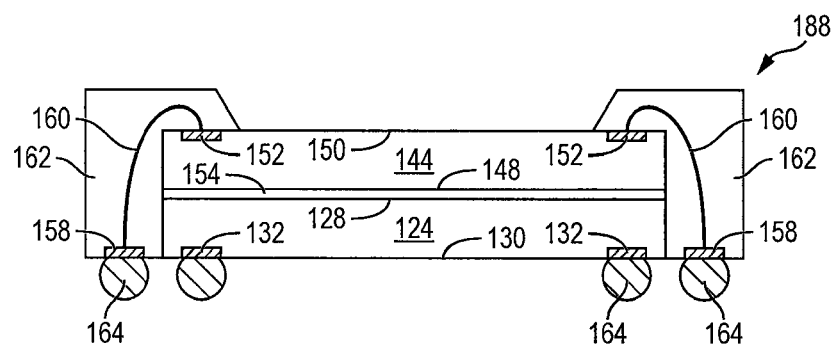
FIG. 8 illustrates the semiconductor PoP with a portion of the encapsulant removed to expose the upper die.

FIG. 8 illustrates an embodiment of semiconductor PoP 188, similar to FIG. 5, with a portion of encapsulant 162 removed to expose active surface 150 of semiconductor die 144. The exposed active surface 150 of semiconductor die 144 offers good heat dissipation and thermal characteristics.

Figure 9:
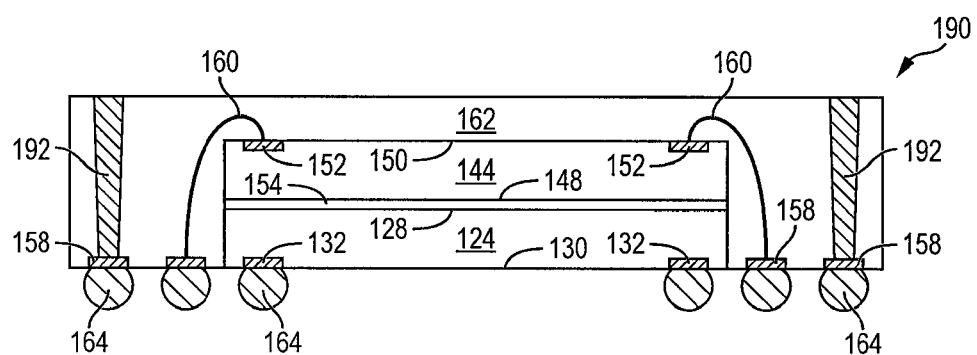
FIG. 9 illustrates the semiconductor PoP with conductive vias formed through the encapsulant.

FIG. 9 illustrates an embodiment of semiconductor PoP 190, similar to FIG. 5, with conductive vias 192 formed through encapsulant 162 down to conductive layer 158. A plurality of vias is formed through encapsulant 162 using laser drilling, mechanic drilling, etching, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 192. Bumps 164 are formed on conductive layer 158 opposite conductive vias 192.

Figure 10:
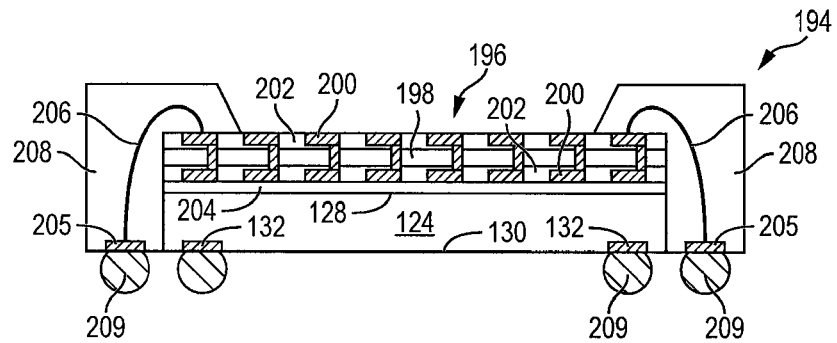
FIG. 10 illustrates the semiconductor PoP with a TSV interposer mounted to the lower semiconductor die.

FIG. 10 illustrates an embodiment of semiconductor PoP 194, similar to FIG. 5, with TSV interposer or component 196 mounted to semiconductor die 124. TSV interposer 196 includes substrate 198 with upper and lower conductive layers 200 and upper and lower insulating layers 202. TSV interposer 196 is bonded to semiconductor die 124 with adhesive layer 204. In one embodiment, TSV interposer 196 in wafer form can be bonded to semiconductor wafer 120 over a carrier, similar to FIGS. 4*d*-4*e*. The TSV interposer wafer and semiconductor wafer 120 are singulated and the peripheral region is expanded, similar to FIGS. 4*f*-4*h*. An electrically conductive layer or seed layer 205 is formed over the carrier within the expanded peripheral region between the stacked semiconductor die and TSV interposer, similar to FIG. 4i. Bond wires 206 are formed between conductive layer 200 and conductive layer 205, similar to FIG. 4j. An encapsulant or molding compound 208 is deposited over semiconductor die 124, bond wires 206, and TSV interposer 196, similar to FIG. 4l. A portion of encapsulant 208 is removed to expose upper conductive layer 200 of TSV interposer 196 for electrical interconnect. A plurality of bumps 209 is formed over conductive layers 132 and 205, similar to FIG. 4n.

Figure 11:
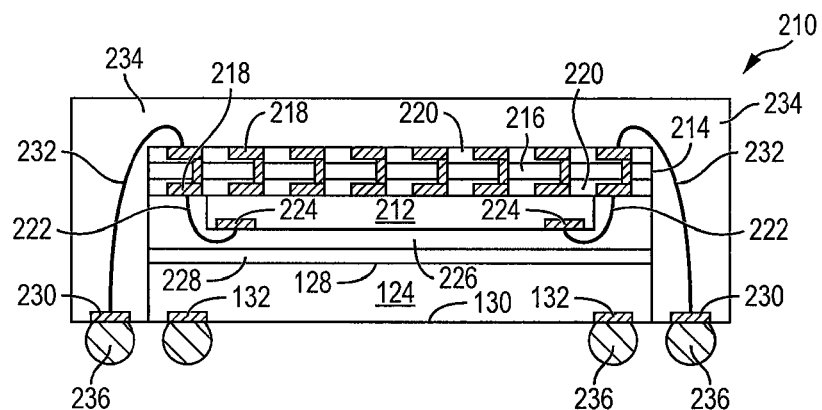
FIG. 11 illustrates the semiconductor PoP with an upper die mounted to a TSV interposer and the upper die/TSV interposer mounted to the lower die.

FIG. 11 illustrates an embodiment of semiconductor PoP 210 with semiconductor die or component 212 mounted to TSV interposer or component 214. Semiconductor die 212 has a back surface and active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 212 may also contain IPDs, such as inductors, capacitors, and resistors, for RF signal processing.

TSV interposer 214 includes substrate 216 with upper and lower conductive layers 218 and upper and lower insulating layers 220. Semiconductor die 212 is mounted back surface to TSV interposer 214. Bond wires 222 are formed between conductive layer 218 and contact pads 224 on the active surface of semiconductor die 212.

An encapsulant or molding compound 226 is deposited over semiconductor die 212, bond wires 222, and TSV interposer 214 using a paste printing, compressive molding, transfer molding, liquid encapsulant molding, vacuum lamination, spin coating, or other suitable applicator. Encapsulant 226 can be polymer composite material, such as epoxy resin with filler, epoxy acrylate with filler, or polymer with proper filler. Encapsulant 226 is non-conductive and environmentally protects the semiconductor device from external elements and contaminants.

An adhesive layer 228 is formed over back surface 128 of semiconductor die 124 from FIG. 4a. The stacked semiconductor die 212 and TSV interposer 214 is mounted to semiconductor die 124 with encapsulant 226 bonded to adhesive layer 228. In one embodiment, the stacked semiconductor die 212 and TSV interposer 214 in wafer form can be bonded to semiconductor wafer 120 over a carrier, similar to FIGS. 4d-4e. The stacked TSV interposer/semiconductor die wafer and semiconductor wafer 120 are singulated and the peripheral region is expanded, similar to FIGS. 4f-4h. An electrically conductive layer or seed layer 230 is formed over the carrier within the expanded peripheral region between the stacked semiconductor die and TSV interposer, similar to FIG. 4i. Bond wires 232 are formed between conductive layer 218 and conductive layer 230, similar to FIG. 4j. An encapsulant or molding compound 234 is deposited over semiconductor die 124, bond wires 232, and the stacked semiconductor die 212 and TSV interposer 214, similar to FIG. 4l. A plurality of bumps 236 is formed over conductive layers 132 and 230, similar to FIG. 4n.

Semiconductor die 124 is electrically connected to bumps 236. Semiconductor die 212 and TSV interposer 214 are electrically connected through bond wires 222 and 232 to conductive layer 230 and bumps 236. Semiconductor die 124 and 212 and TSV interposer 214 are bonded at the wafer level. Semiconductor PoP 210 has a reduced height because bumps 236 are attached directly to conductive layer 230 and contact pads 132 of semiconductor die 124. The carrier maintains coplanarity between conductive layer 230 and contact pads 132 and uniformity of bumps 236. The exposed active surface 130 of semiconductor die 124 offers good heat dissipation and thermal characteristics.

Figure 12:
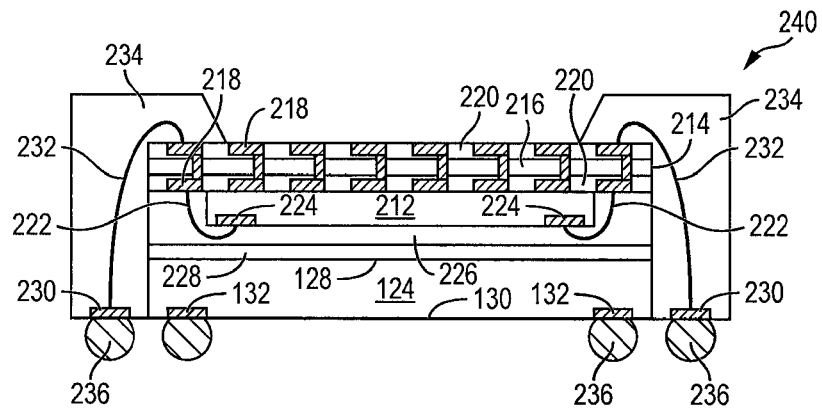
FIG. 12 illustrates the semiconductor PoP with the TSV interposer exposed from the encapsulant for electrical interconnect.

FIG. 12 illustrates an embodiment of semiconductor PoP 240, similar to FIG. 11, with a portion of encapsulant 234 removed to expose upper conductive layer 218 of TSV interposer 214 for electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   mounting a first semiconductor wafer including a plurality of first semiconductor die to the carrier;
   mounting a second semiconductor wafer including a plurality of second semiconductor die to a non-active surface of the first semiconductor wafer;
   singulating the first and second semiconductor wafers to separate a plurality of stacked first and second semiconductor die;
   forming a conductive layer over the carrier and coplanar with an active surface of the plurality of first semiconductor die;
   forming a bond wire electrically coupling contact pads formed on the second semiconductor die and the conductive layer;
   depositing an encapsulant over the stacked first and second semiconductor die, bond wire, and carrier;
   removing the carrier from over the conductive layer and contact pads formed on the active surface of the first semiconductor die; and
   forming a plurality of bumps directly on the conductive layer and contact pads on the first semiconductor die.

2. The method of claim 1, further including expanding a peripheral region between the stacked first and second semiconductor die.

3. The method of claim 1, wherein the bumps formed directly on the conductive layer are coplanar with the bumps formed directly on the contact pads of the first semiconductor die.

4. The method of claim 1, further including removing a portion of the encapsulant over the second semiconductor die.

5. The method of claim 1, further including forming a plurality of conductive vias through the encapsulant between the stacked first and second semiconductor die.

6. A method of making a semiconductor device, comprising:
   providing a first wafer including a plurality of first semiconductor components;
   disposing a second wafer including a plurality of second semiconductor components over the first wafer;
   singulating the first and second wafers to separate a plurality of stacked first and second semiconductor components;
   forming a conductive layer coplanar with a contact pad on an active surface of the first semiconductor components;
   depositing a first encapsulant over the stacked first and second semiconductor components; and
   forming an interconnect structure directly on the contact pad on the active surface of the first semiconductor components with a portion of the active surface remaining uncovered with respect to the interconnect structure.

7. The method of claim 6, further including:
forming a bond wire between the second component and the conductive layer; and
forming the interconnect structure directly on the conductive layer.

8. The method of claim 6, further including:
providing a carrier with the first and second components disposed over the carrier;
forming a via partially through the carrier;
forming the conductive layer within the via;
forming a bond wire between the second component and the conductive layer in the via; and
removing the carrier to leave the conductive layer extending beyond a level of the first component.

9. The method of claim 8, wherein the interconnect structure formed directly on the first component is coplanar with the conductive layer.

10. The method of claim 6, further including expanding a peripheral region between the stacked first and second components.

11. The method of claim 6, further including removing a portion of the encapsulant over the second component.

12. The method of claim 6, wherein the first component includes a first semiconductor die and the second component includes a second semiconductor die or interposer.

13. The method of claim 6, wherein the second component includes:
providing an interposer;
mounting a semiconductor die to the interposer; and
depositing a second encapsulant over the semiconductor die and interposer.

14. A method of making a semiconductor device, comprising:
providing a first component;
disposing a second component over the first component;
forming a conductive layer in a peripheral region around the first component;
forming a first interconnect structure over a first surface of the conductive layer and electrically coupling the second component to the conductive layer;
depositing an encapsulant over the first and second components and the conductive layer; and
forming a second interconnect structure directly on an active surface of the first component and a second surface of the conductive layer opposite the first surface and without covering a portion of the active surface of the first component.

15. The method of claim 14, wherein the first interconnect structure includes a bond wire.

16. The method of claim 15, wherein the second interconnect structure formed directly on the active surface of the first component is coplanar with the second interconnect structure formed over the conductive layer.

17. The method of claim 14, further including:
providing a carrier with the first and second components disposed over the carrier;
forming a via partially through the carrier;
forming the conductive layer within the via;
forming the first interconnect structure between the second component and the conductive layer in the via; and
removing the carrier to leave the conductive layer extending beyond a level of the first component.

18. The method of claim 17, wherein the second interconnect structure formed directly on the active surface of the first component is coplanar with the conductive layer.

19. The method of claim 14, further including expanding the peripheral region between the first and second components.

20. The method of claim 14, wherein the first component includes a first semiconductor die and the second component includes a second semiconductor die or interposer.

21. A method of making a semiconductor device, comprising:
providing a first component and a second component stacked over the first component;
forming a conductive layer coplanar with a contact pad of the first component;
forming an interconnect structure electrically coupled to the second component and conductive layer; and
forming a bump directly on the contact pad of the first component.

22. The method of claim 21, wherein the first component includes a first semiconductor die and the second component includes a second semiconductor die or interposer.

23. The method of claim 21, further including:
depositing an encapsulant over the first and second components; and
removing a portion of the encapsulant to expose a surface of the second component.

* * * * *